(12) United States Patent
 Gresback et al.

(10) Patent No.: US 11,251,342 B2
(45) Date of Patent: *Feb. 15, 2022

(54) STABILIZED FLUORIDE PHOSPHOR FOR LIGHT EMITTING DIODE (LED) APPLICATIONS

(71) Applicant: CREELED, INC., Newark, CA (US)

(72) Inventors: Ryan Gresback, Santa Barbara, CA (US); Kenneth Lotito, Santa Barbara, CA (US); Linjia Mu, Qingdao (CN)

(73) Assignee: CREELED, INC., Newark, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 16/794,414

(22) Filed: Feb. 19, 2020

(65) Prior Publication Data
US 2020/0185572 A1 Jun. 11, 2020

Related U.S. Application Data

(62) Division of application No. 15/994,105, filed on May 31, 2018, now Pat. No. 10,608,148.

(51) Int. Cl.
*H01L 33/50* (2010.01)
*C09K 11/61* (2006.01)
(Continued)

(52) U.S. Cl.
CPC .......... *H01L 33/502* (2013.01); *C09K 11/025* (2013.01); *C09K 11/0833* (2013.01);
(Continued)

(58) Field of Classification Search
CPC ..... H01L 33/502; H01L 33/005; H01L 33/44; C09K 11/025; C09K 11/0833; C09K 11/59; C09K 11/616; C09K 11/55; C09K 11/617
See application file for complete search history.

(56) References Cited

U.S. PATENT DOCUMENTS

| 7,223,482 B2 | 5/2007 | Do et al. |
| 8,252,613 B1 | 8/2012 | Lyons et al. |

(Continued)

FOREIGN PATENT DOCUMENTS

| JP | 2007091874 | 4/2007 |
| JP | 2012177049 | 9/2012 |

(Continued)

OTHER PUBLICATIONS

P. Arunkumar et al., "Hydrophobic Organic Skin as a Protective Shield for Moisture-Sensitive Phosphor-Based Optoelectronic Devices", *ACS Appl. Mater. Interfaces*, 9, 8 (2017) pp. 7232-7240.

(Continued)

*Primary Examiner* — Syed I Gheyas
(74) *Attorney, Agent, or Firm* — Crowell & Moring LLP

(57) ABSTRACT

A stabilized fluoride phosphor for light emitting diode (LED) applications includes a particle comprising manganese-activated potassium fluorosilicate and an inorganic coating on each of the particles. The inorganic coating comprises a silicate. A method of making a stabilized fluoride phosphor comprises forming a reaction mixture that includes particles comprising a manganese-activated potassium fluorosilicate; a reactive silicate precursor; a catalyst; a solvent; and water in an amount no greater than about 10 vol. %. The reaction mixture is agitated to suspend the particles therein. As the reactive silicate precursor undergoes hydrolysis and condensation in the reaction mixture, an inorganic coating comprising a silicate is formed on the particles. Thus, a stabilized fluoride phosphor is formed.

14 Claims, 8 Drawing Sheets

(51) Int. Cl.
  *H01L 33/00* (2010.01)
  *H01L 33/44* (2010.01)
  *C09K 11/08* (2006.01)
  *C09K 11/59* (2006.01)
  *C09K 11/55* (2006.01)
  *C09K 11/02* (2006.01)

(52) U.S. Cl.
  CPC .............. *C09K 11/55* (2013.01); *C09K 11/59* (2013.01); *C09K 11/616* (2013.01); *C09K 11/617* (2013.01); *H01L 33/005* (2013.01); *H01L 33/44* (2013.01)

(56) References Cited

U.S. PATENT DOCUMENTS

| | | |
|---|---|---|
| 9,120,972 B2 | 9/2015 | Yoshida |
| 9,580,643 B2 | 2/2017 | Weiler et al. |
| 9,614,129 B2 | 4/2017 | Lee et al. |
| 2008/0003160 A1 | 1/2008 | Kim et al. |
| 2008/0241590 A1 | 10/2008 | Kim et al. |
| 2013/0113365 A1 | 5/2013 | Yamasuge et al. |
| 2014/0327023 A1 | 11/2014 | Brewster et al. |
| 2015/0048399 A1 | 2/2015 | Weiler et al. |
| 2015/0084075 A1 | 3/2015 | Watanabe |
| 2015/0329770 A1 | 11/2015 | Kaneyoshi et al. |
| 2015/0380613 A1 | 12/2015 | Hiramatsu et al. |
| 2015/0380614 A1 | 12/2015 | Hiramatsu et al. |
| 2016/0155909 A1* | 6/2016 | Lee ................ C09K 11/00 438/27 |
| 2016/0160122 A1 | 6/2016 | You et al. |
| 2016/0244663 A1* | 8/2016 | Murphy ............ C09K 11/617 |
| 2016/0340577 A1 | 11/2016 | Hiramatsu |
| 2016/0376499 A1 | 12/2016 | Setlur et al. |
| 2017/0125650 A1 | 5/2017 | Pickett et al. |
| 2017/0130125 A1 | 5/2017 | Shibamoto |
| 2017/0145306 A1 | 5/2017 | Shibamoto |
| 2019/0086733 A1 | 3/2019 | Min et al. |
| 2019/0136128 A1* | 5/2019 | Murphy ............ H01L 33/505 |

FOREIGN PATENT DOCUMENTS

| | | |
|---|---|---|
| JP | 2012212862 | 11/2012 |
| JP | 2012008524 | 1/2021 |
| WO | WO 2015/102876 A1 | 7/2015 |
| WO | 2018/002556 A1 | 1/2018 |
| WO | 2018/005448 A1 | 1/2018 |
| WO | 2018/093832 A1 | 5/2018 |

OTHER PUBLICATIONS

H-D Nguyen et al., "Waterproof Alkyl Phosphate Coated Fluoride Phosphors for Optoelectronic Materials", *Angewandte Communications Int. Ed.*, vol. 54, Issue 37 (Sep. 7, 2015) pp. 10862-10866.

A. G. Paulusz, "Efficient Mn(IV) Emission in Fluorine Coordination", *J. Electrochem. Soc.*, vol. 120, No. 7 (Jul. 1973) pp. 942-947.

H. F. Sijbom et al., "$K_2SiF_6:Mn^{4+}$ as a Red Phosphor for Displays and Warm-White LEDs: a Review of Properties and Perspectives", *Optical Materials Express*, 7, 9 (Sep. 2017) pp. 3332-3365.

International Search Report and Written Opinion for corresponding PCT Application No. PCT/US2019/033718 dated Aug. 13, 2019.

Translation of Japanese Office Action from corresponding JP Application No. 2020-566926 dated Dec. 6, 2021.

\* cited by examiner

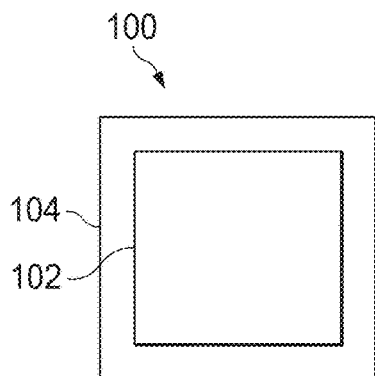 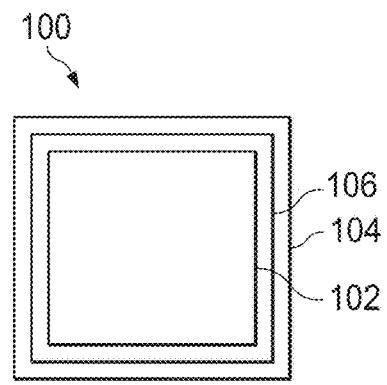
FIG. 1A  FIG. 1B
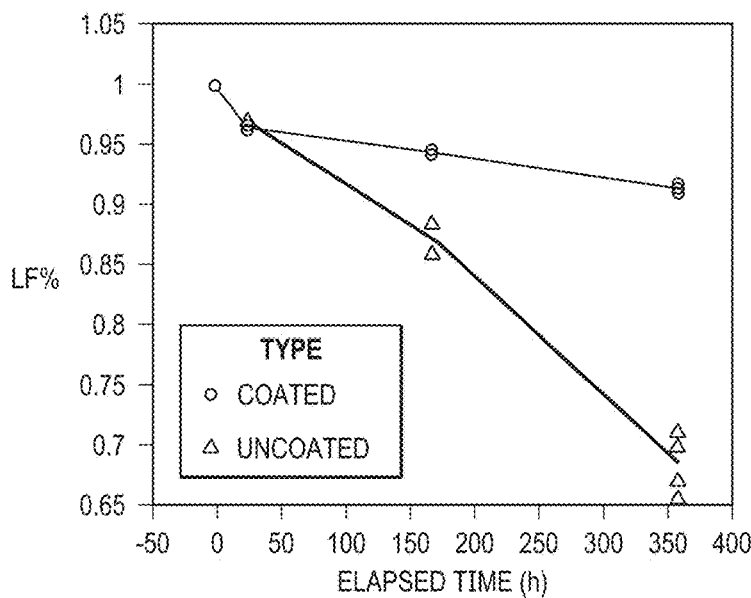
FIG. 2A
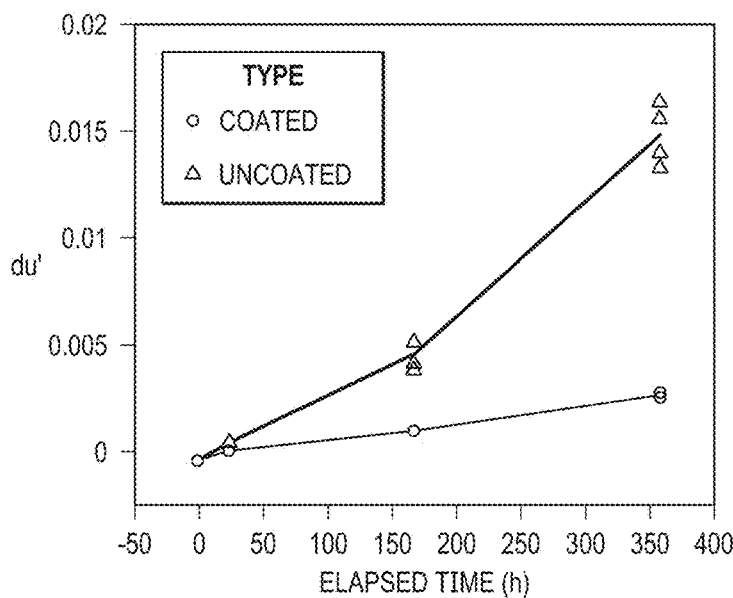
FIG. 2B

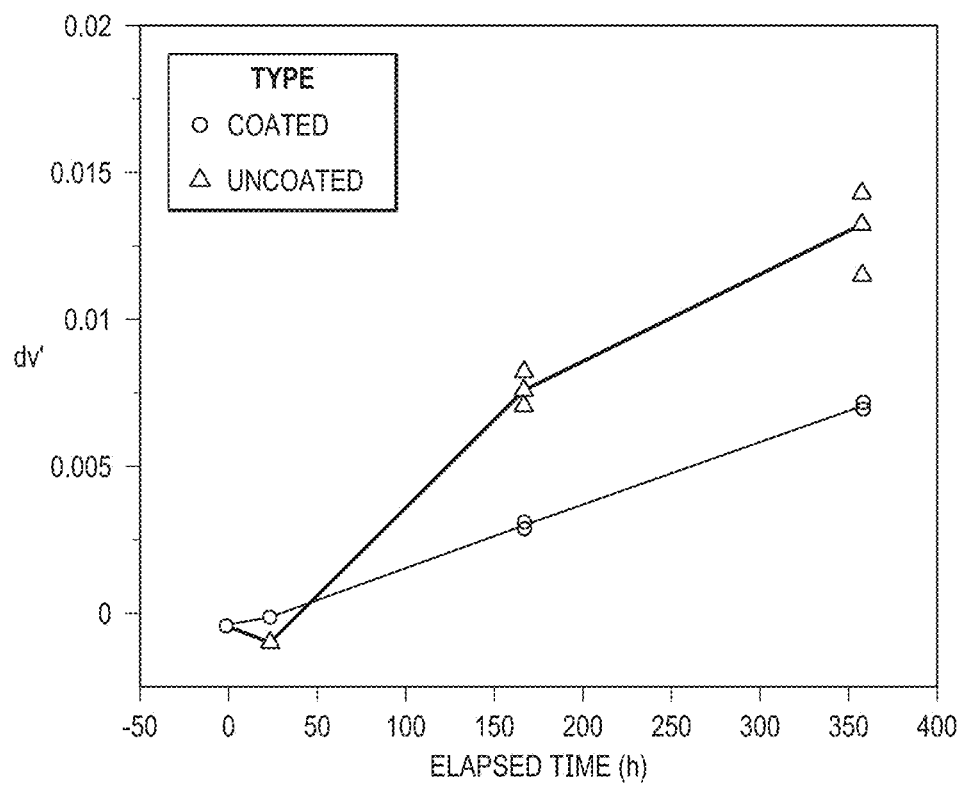
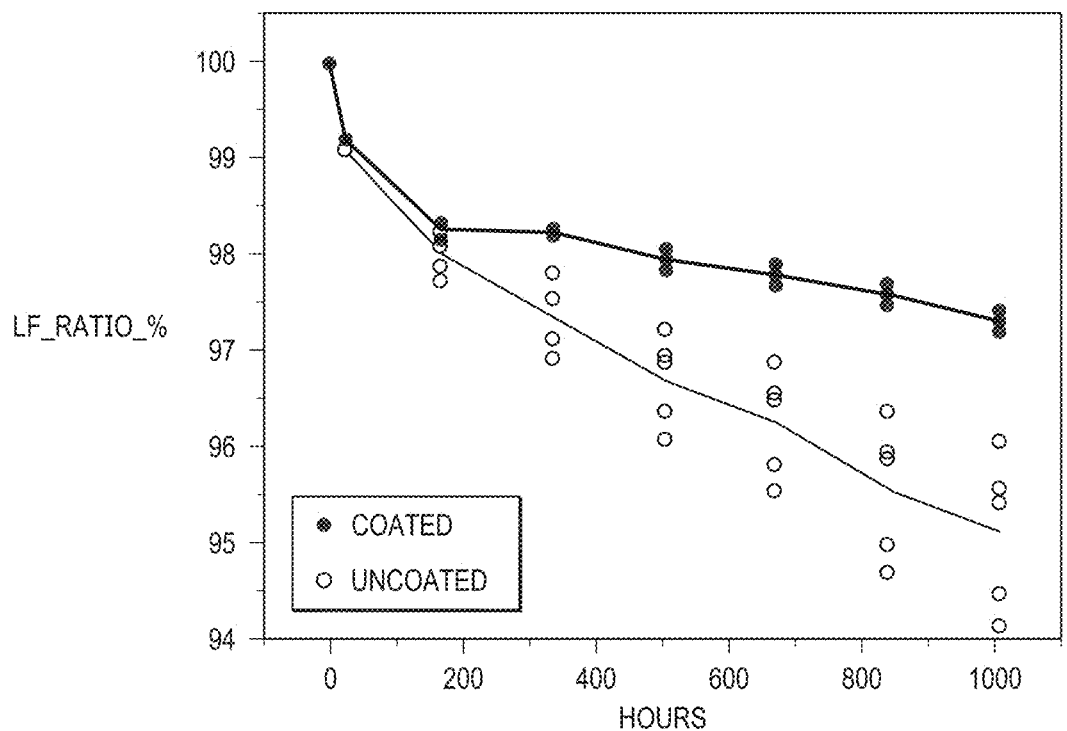

STABILIZED FLUORIDE PHOSPHOR FOR LIGHT EMITTING DIODE (LED) APPLICATIONS

RELATED APPLICATIONS

The present patent document is a division of U.S. patent application Ser. No. 15/994,105, filed on May 31, 2018, and which is hereby incorporated by reference in its entirety.

TECHNICAL FIELD

The present disclosure is related generally to light emitting diodes (LEDs) and more specifically to coated fluoride phosphors for LED applications.

BACKGROUND

Manganese-activated, red-emitting fluoride phosphors have recently emerged as an important class of LED downconverters due to their narrow-band spectral emission, high photoluminescence efficiency, and low thermal quenching. When incorporated into LED components, these phosphors can enhance the performance of both lighting and display products. Of this class of materials, manganese-activated potassium fluorosilicate (KSF:Mn) is the most notable, having become commercially available in the past few years.

For lighting applications, KSF:Mn enables warm-white LED components with high luminous efficacy (lm/VV) while preserving a high color rendering index (CRI), typically greater than 90. The phosphor's narrow red emission band results in less "wasted" light emitted into the far-red and infrared when compared to conventional phosphors. In displays, KSF:Mn enables a wider color gamut due to its saturated narrow band emission.

Yet the wide-spread commercial adoption of KSF:Mn in solid state lighting has been limited, in part, by the reliability of the material, which is sensitive to moisture, high temperature, and high blue-flux density. When exposed to water, for example, the manganese activator can rapidly discolor, resulting in a dramatic decline in performance. Furthermore, the fluorosilicate host can generate corrosive fluoride species which pose a threat to the various sensitive materials found in LED components.

BRIEF SUMMARY

A stabilized fluoride phosphor for light emitting diode applications includes particles comprising manganese-activated potassium fluorosilicate and an inorganic coating on each of the particles. The inorganic coating comprises a silicate.

A stabilized salt includes particles comprising a water-soluble salt and an inorganic coating on each of the particles. The inorganic coating comprises a silicate.

A method of making a stabilized fluoride phosphor includes forming a reaction mixture that includes particles comprising a manganese-activated potassium fluorosilicate; a reactive silicate precursor; a catalyst; a solvent; and water in an amount no greater than about 10 vol. %. The reaction mixture is agitated to suspend the particles therein. As the reactive silicate precursor undergoes hydrolysis and condensation in the reaction mixture, an inorganic coating comprising a silicate is formed on each of the particles. Thus, a stabilized fluoride phosphor is formed.

A method of making a stabilized salt includes forming a reaction mixture that includes particles comprising a water-soluble salt; a reactive silicate precursor; a catalyst; a solvent; and water in an amount no greater than about 10 vol. %. The reaction mixture is agitated to suspend the particles therein. As the reactive silicate precursor undergoes hydrolysis and condensation in the reaction mixture, an inorganic coating comprising a silicate is formed on each of the particles. Thus, a stabilized salt is formed.

BRIEF DESCRIPTION OF THE DRAWINGS

FIG. 1A is a schematic of a stabilized fluoride phosphor according to one embodiment.

FIG. 1B is a schematic of a stabilized fluoride phosphor according to another embodiment.

FIG. 2A shows the change in luminous flux (LF) as a function of time for LED components containing uncoated and coated Mn-activated potassium fluorosilicate particles during a high temperature storage (HTS) test.

FIG. 2B shows the change in u' color point as a function of time for LED components containing uncoated and coated Mn-activated potassium fluorosilicate particles during a HTS test.

FIG. 2C shows the change in v' color point as a function of time for LED components containing uncoated and coated Mn-activated potassium fluorosilicate particles during a HTS test.

FIG. 3A shows the change in luminous flux ratio (LF ratio) as a function of time for LED components containing uncoated and coated Mn-activated potassium fluorosilicate particles during a high temperature operating life (HTOL) test.

DETAILED DESCRIPTION

Definitions

Figure 3B:
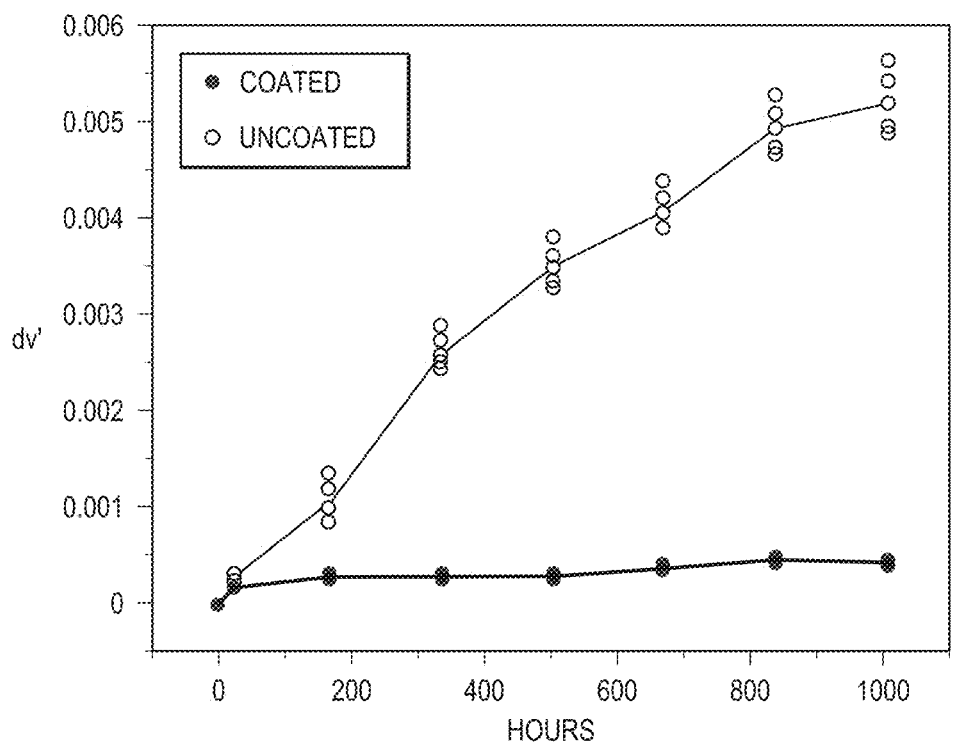
FIG. 3B shows color shift as a function of time for LED components containing uncoated and coated Mn-activated potassium fluorosilicate particles during a HTOL test.

An "activator" of a phosphor comprising a host crystal may be understood to be a doping agent, or "dopant," in the host crystal. For example, a transition metal element such as manganese may function as a dopant or activator for a host crystal comprising a fluoride compound. The activator may be utilized to obtain certain luminescence properties from the phosphor.

What is referred to as "color shift" may be expressed using du' and dv', which describe the chromaticity shift in the CIE 1976 chromaticity diagram (u', v'), where for example du'(x)=u'(t=x)−u'(t=0), and similarly for dv'.

A first device that is described as being "in optical communication with" a second device may be understood to be positioned such that light from the first device reaches the second device, or vice versa.

"Dominant wavelength" refers to the wavelength of light that has the same apparent color as the light emitted from an LED, as perceived by the human eye. The dominant wavelength differs from peak wavelength in that the dominant wavelength takes into account the sensitivity of the human eye to different wavelengths of light.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. The terms "elements" and "a plurality of elements" may be understood to refer to "more than one element," where "element" may be replaced with any noun. It may be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

This disclosure describes a stabilized fluoride phosphor for light emitting diode (LED) applications and a scaleable and cost-effective sol-gel process to prepare the stabilized fluoride phosphor. A manganese-activated fluoride phosphor in particulate form is coated with an inorganic coating comprising a silicate, which acts as a protective shell for the phosphor. When the coated phosphor particles are incorporated into LEDs, the inorganic coating serves both to (a) protect the phosphor from atmospheric oxygen and moisture and (b) protect the LED component and its constituent materials from the corrosive action of fluorine-containing byproducts. The inorganic coating can enhance the stability of LED components containing fluoride-based phosphors, overcoming one of the primary barriers to widespread commercial adoption of such phosphors in solid-state lighting.

Referring to the schematic of FIG. 1A, the stabilized fluoride phosphor 100 includes a particle 102 comprising manganese-activated potassium fluorosilicate and an inorganic coating 104 on the particle 102. The inorganic coating 104 comprises a silicate and functions as an impermeable or nearly impermeable barrier to water and/or oxygen. A silicate may be understood to be a compound comprising silicon and oxygen; one example, the silicate comprises $SiO_x$, where $0.5 \leq x \leq 2.5$. The $SiO_x$ may be referred to as silica, a silica network or, more specifically, amorphous silica. The inorganic coating 104 may further include Si—OH groups as a consequence of the solution-phase coating process, which is described in detail below. The manganese-activated potassium fluorosilicate may be manganese-activated $K_2SiF_6$, which may be referred to as $K_2SiF_6$:Mn or KSF:Mn.

For practical applications, the stabilized fluoride phosphor 100 includes a number of the particles 102. During the coating process, the particles 102 are suspended and deagglomerated in a reaction mixture such that the inorganic coating 104 forms on each particle 102. Preferably, the inorganic coating 104 conformally coats each of the particles 102. As would be recognized by the skilled artisan, a conformal coating is one that conforms to the particle surface and may fully encapsulate the particle 102. The coating 104 may range in thickness from about 5 nm to about 2 microns, depending on the duration of the sol-gel reaction and the relative amounts of the reagents employed. Thicker coatings 104 may improve the stability of the particle 102, as further discussed below. Accordingly, a preferred thickness range may be from about 0.1 μm to about 2 μm.

In some cases, the stabilized fluoride phosphor 100 may further comprise a fluoride layer 106 between the particle 102 and the inorganic coating 104, as illustrated in FIG. 1B. The fluoride layer 106 may help to improve the thermal and chemical stability of the phosphor. The fluoride layer 106 may comprise potassium fluorosilicate (e.g., $K_2SiF_6$) without an activator, or another fluoride compound. The fluoride layer may have a thickness in a range from about 5 nm to about 5 microns.

The manganese-activated potassium fluorosilicate particles are commercially available. Typically, the particles have a nominal size (width or diameter) in a range from about 5 microns to about 30 microns.

As a demonstration of the improvement in stability achieved for the $K_2SiF_6$:Mn ("KSF:Mn") phosphor when coated with a silicate as described, high temperature storage (HTS) tests are carried out on LED components including coated and uncoated phosphors. HTS testing can be used to evaluate the reliability of the LED components during long-term storage at elevated temperatures. A series of warm-white, 90 CRI (color rendering index) LED components are fabricated, where half the components include an uncoated KSF:Mn phosphor and the other half include a coated KSF:Mn phosphor. In this example, the coating comprises silica, as described above. The components are subjected to an HTS test at 195° C. for approximately 400 hours.

After 400 hours, the LED components prepared with the uncoated KSF:Mn phosphor have degraded significantly, dropping to about 70% of initial luminous intensity and showing about 15 steps of u' and v' color shift, as shown in FIGS. 2A-2C, where each step is 0.001 in either u' or v' space. In contrast, the LED components prepared with the silica-coated KSF:Mn phosphor shifted by only about 3 steps in u', 7 steps in v', and retained greater than 90% of initial luminous intensity over the same test period. This enhancement in stability is attributed to the ability of the silica shell to protect the KSF:Mn particles from degradation and isolate the LED component from the corrosive action of fluoride species.

High temperature operating life (HTOL) tests are carried out to evaluate the reliability of LED components including silica-coated and uncoated phosphors. The impact of the phosphor coating in a Cree MHB-B component at a color temperature of 3000K and 90 CRI operating at 700 mA and 9 V (nominally 6.3 W), with a heat sink and ambient temperature of 85° C. is investigated. Referring to FIGS. 3A and 3B, the results show an improvement in both luminous flux (LF ratio) stability and color shift stability (attributed to silicone stability).

Figure 4:
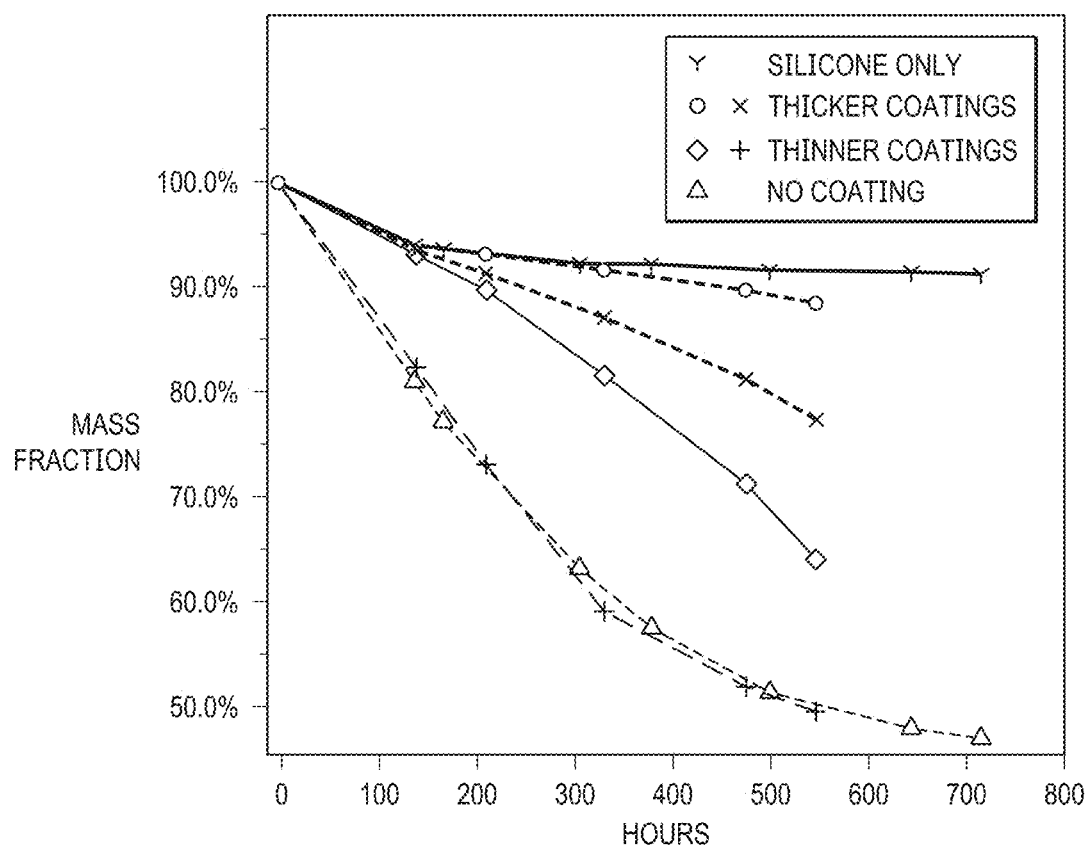
FIG. 4 shows the results of mass loss experiments on cured, free-standing silicone disks stored at 195° C. and containing: no phosphor; uncoated Mn-activated potassium fluorosilicate particles; and silica-coated Mn-activated potassium fluorosilicate particles.
Figure 5A:
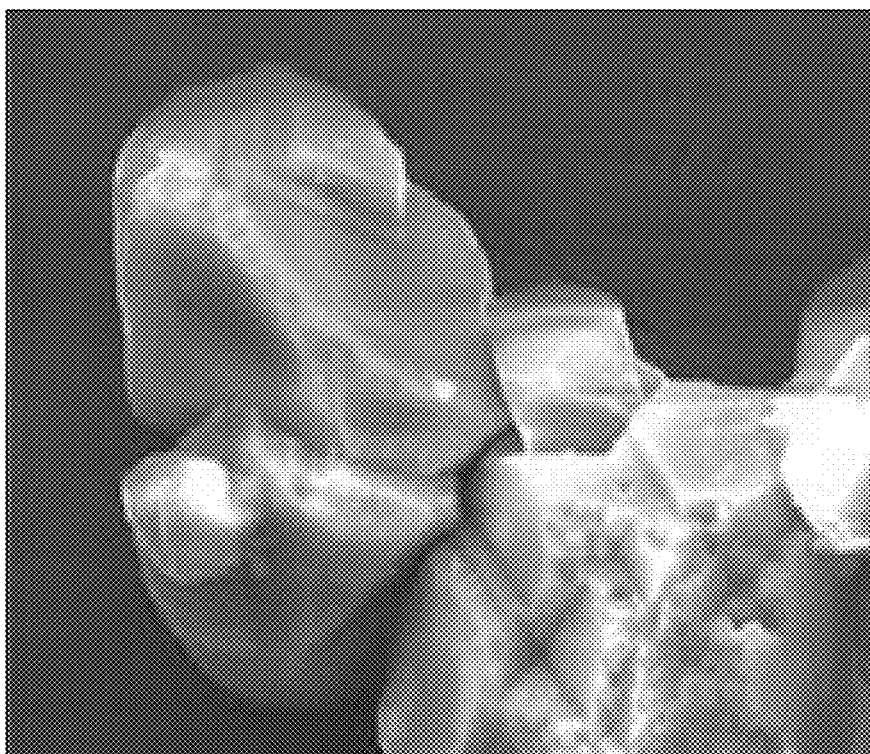
FIGS. 5A to 5D show scanning electron microscope (SEM) images at 5000× magnification of silica-coated Mn-activated potassium fluorosilicate particles with increasing shell (coating) thickness.
Figure 5B:
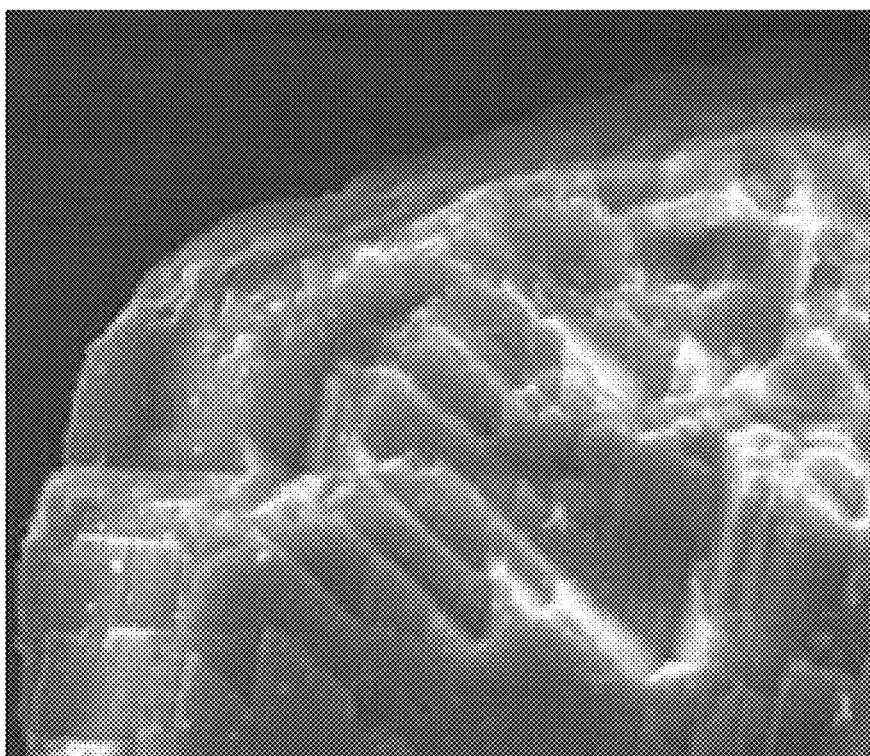
Figure 5C:
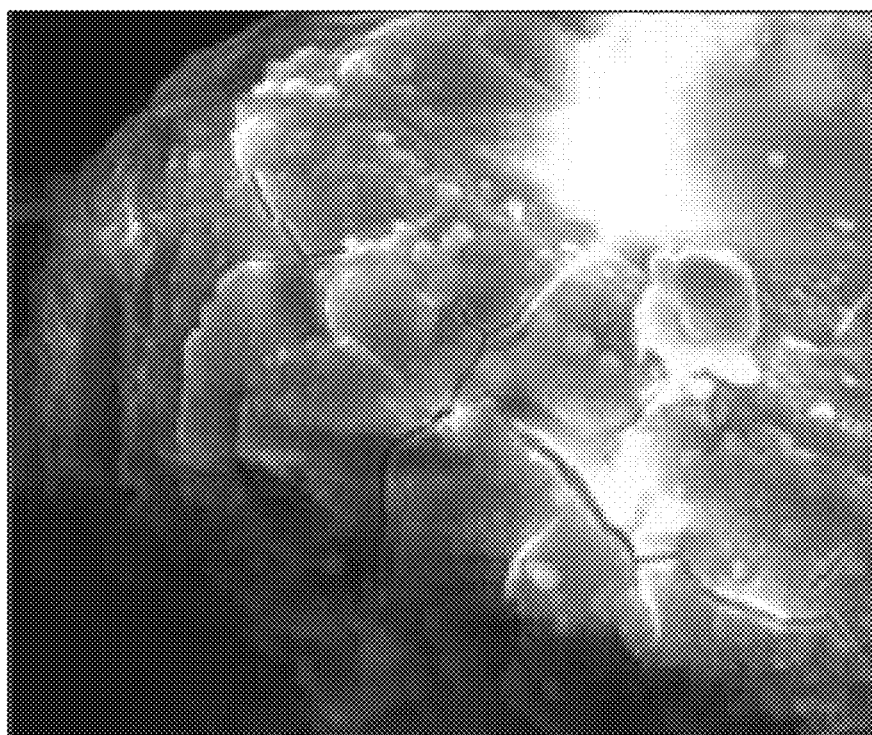
Figure 5D:
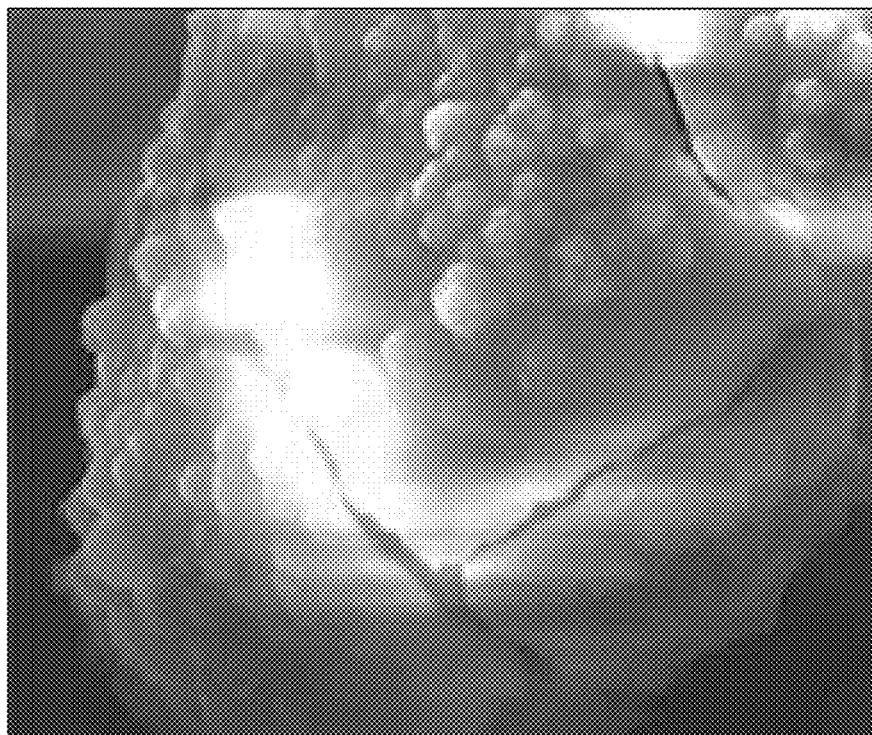

In another demonstration, cured, free-standing silicone disks are prepared containing no phosphor, uncoated KSF:Mn phosphor, and silica-coated KSF:Mn phosphor. Silicone is commonly employed as an encapsulant for LEDs with phosphor particles dispersed in the silicone to effect down-conversion of light emitted from the LED. The silicone disks are stored at 195° C. and their weight is monitored over time. Referring to FIG. 4, the data show that the disk prepared with uncoated KSF:Mn loses more than 50% of its initial mass after 550 hours. Disks prepared with thin or partial coatings of silica on the KSF:Mn particles, where the coatings are estimated to be less than 100 nm in thickness, show a small improvement in one example and almost no improvement in another. In contrast, the disks prepared with thicker coatings on the KSF:Mn particles lose only 10% and 20% of their initial mass. The thicker coatings are estimated to be at least 100 nm in thickness and as thick as 2 microns. For reference, a silicone disk containing no phosphor loses about 10% of its mass over the same period. In addition to being measured, the mass loss may be visually observed as shrinkage of the disks. The results suggest that uncoated KSF:Mn has a severe chemical interaction with the silicone resulting in significant degradation and mass-loss. This degradation is associated with a positive dv' color shift in components. Application of a silica coating effectively reduces this interaction and slows the rate of mass loss significantly.

Figure 6:
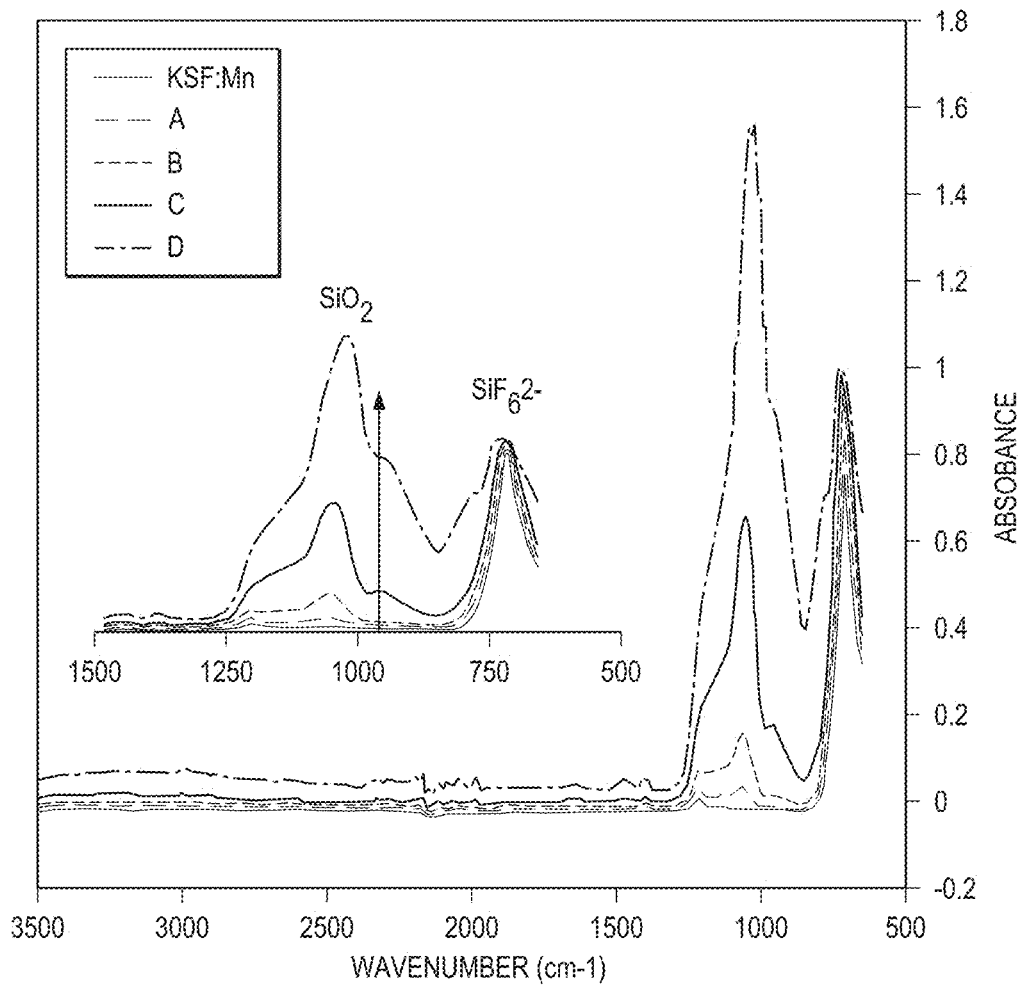
FIG. 6 shows Fourier-transform infrared spectroscopy (FTIR) absorption spectra for the coated particles of FIGS. 5A-5D, where the inset shows detail of $SiO_x$ and $SiF_x$ absorption signals corresponding to the silica groups of the coating and the $SiF_6^{2-}$ of the potassium fluorosilicate particles.

FIGS. 5A to 5D show scanning electron microscope (SEM) images at 5000× magnification of silica-coated Mn-activated potassium fluorosilicate particles with increasing shell (coating) thickness. FIG. 6 shows FTIR absorption spectra in attenuated total reflection (ATR) mode for the coated phosphor particles shown in FIGS. 5A to 5D pressed onto the ATR crystal. The stabilized fluoride phosphor has a first feature in the infrared absorption spectrum at about 850 $cm^{-1}$ associated with the fluorosilicate ($SiF_6^{2-}$) content of the sample and a second feature in the infrared absorption spectrum between about 1020 $cm^{-1}$ and 1070 $cm^{-1}$ corresponding to the $SiO_x$ content of the sample. A ratio of the absorption intensity of the $SiO_x$ feature to the $SiF_6^{2-}$ feature is between about 0.05 and 2.5, with larger ratios indicating thicker silica coatings. There is a link between coating thickness and phosphor stability as discussed above and suggested by the data of FIG. 4; however, thinner coatings may be preferred from a processing and materials standpoint. Accordingly, it may be preferred that the ratio of the maximum absorption intensity $SiO_2$ feature to the $SiF_6^{2-}$ is at least about 0.5, at least about 1, or at least about 1.5. For some applications, however, the ratio may be no higher than 1.5, no higher than 2, or no higher than 2.5.

Other experiments indicate that photoluminescence quantum yield (PLQY) of the KSF:Mn phosphor is largely unchanged upon deposition of the silica coating; the PLQY after coating is ≥95% of the value prior to coating.

The composition of the inorganic coating may be modified by incorporating organic residues (e.g., carbon) into the silica network. This may be accomplished by using organosilane precursors during the coating process, as described below. Also or alternatively, nitrogen or sulfur may be included in the inorganic coating by selecting an appropriate silane precursor.

For some applications, the inorganic coating may comprise a multicomponent silicate including aluminum, boron, and/or titanium. Also or alternatively, the inorganic coating may comprise an oxide of aluminum, boron, and/or titanium, such as an aluminate, a borate, or a titanate.

It is contemplated that the KSF:Mn phosphor may be replaced with any water-soluble salt, which may or may not function as a phosphor. The above-described coating method provides a low-water and low-polarity environment that may be suitable for the growth of an inorganic coating comprising a silicate on a variety of ionic solids, including various chlorides, bromides, iodides, and fluorides. For example, the method may be used to form an inorganic (e.g., silica) coating on NaCl, $Na_2SiF_6$, KF, $K_2SiF_6$, $K_2TiF_6$, $Rb_2SiF_6$, $Cs_2GeF_6$, $Cs_2SiF_6$, $Cs_2MnF_6$, $Cs_2SnF_6$, $MgCl_2$, and other salts. In general, suitable salts may have a chemical formula $A_xB_yC_z$, where x is from about 1 to about 2, y is from about 1 to about 2, and z is about 6, and where A is selected from Na, K, Cs, Ca, Sr, and Ba, B is selected from Si, Ge, Sn, Ti, and Al, and C is selected from F and Cl. Such compounds are easily dissolved in water and thus may be difficult to coat using typical solution methods. Thus, in an alternative embodiment, the method may yield a stabilized salt including particles comprising a water-soluble salt and an inorganic coating on each of the particles, where the inorganic coating comprises silicate, such as $SiO_x$ (0.5≤x≤2.5). The inorganic coating of the water-soluble salt may have any of the characteristics described above or elsewhere in this disclosure for the stabilized fluoride phosphor.

The method developed to form the stabilized fluoride phosphor (or the stabilized salt) may be described as a sol-gel method.

The method comprises, according to one embodiment, forming a reaction mixture that includes the following reagents: particles comprising a manganese-activated potassium fluorosilicate; a reactive silicate precursor; a catalyst; a solvent; and water in an amount no greater than about 10% by volume. The reaction mixture is agitated to suspend the particles therein. As the reactive silicate precursor undergoes hydrolysis and condensation in the reaction mixture, an inorganic coating comprising a silicate is formed on the particles, thereby forming a stabilized fluoride phosphor comprising silicate-coated, manganese-activated fluorosilicate particles.

TABLE 1

Exemplary volumes of reagents (per gram of phosphor)

|  | Volume Solvent (ml/g) | Volume Water (ml/g) | Volume silicate precursor (e.g., TEOS) per addition (ml/g) | Volume Catalyst (ml/g) |
|---|---|---|---|---|
| Low | 5 | 0.2 | 0.12 | 0.20 |
| High | 60 | 2 | 3 | 3.5 |
| Preferred | 20 to 40 | 0.3 to 1 | 0.3 to 1.5 | 0.5 to 2 |

According to another embodiment, the method comprises forming a reaction mixture that includes the following reagents: particles comprising a water-soluble salt; a reactive silicate precursor; a catalyst; a solvent; and water in an amount no greater than about 10% by volume. The reaction mixture is agitated to suspend the particles therein. As the reactive silicate precursor undergoes hydrolysis and condensation in the reaction mixture, an inorganic coating comprising a silicate is formed on the particles, thereby forming a stabilized salt comprising silicate-coated, water-soluble salt particles. In one embodiment, the silicate comprises $SiO_x$, where $0.5 \leq x \leq 2.5$.

The synthesis and processing description below may in some cases refer specifically to the stabilized fluoride phosphor of the first embodiment. However, it is understood that the description below also applies more generally to the stabilized salts of the second embodiment. In other words, each synthesis or processing step described below can be applied to either the manganese-activated potassium fluorosilicate particles in particular or to the water-soluble salt particles in general. As mentioned above, the stabilized salt formed in the process may or may not behave as a phosphor.

The method may be carried out by adding some or all of the reagents, in particular the reactive silicate precursor, to the reaction mixture gradually, e.g., over minutes, hours, or days. For example, one or more of the reagents may be added in portions over several days, or one or more of the reagents may be continuously infused into the reaction mixture using a pump.

After formation of the stabilized fluoride phosphor or the stabilized salt, the silicate-coated particles may be washed in tetrahydrofuran or isopropanol for purification, or separation from the catalyst, solvent, and any unreacted silicate precursor. Preferably, the reaction mixture is largely devoid of free silicate in particulate form; most or all of the silicate formed in the reaction may be conformally adhered to the surface of each particle. It is noted that even after removal from the reaction mixture, condensation of the silicate may continue to occur and thus the inorganic coating may continue to form outside the reaction mixture; that is, the inorganic coating may increase in thickness and/or density after removal of the particles from the reaction mixture. The particles may undergo drying at a temperature in a range from about 40° C. to about 200° C. to remove any volatile species left over from the synthesis.

Gentle agitation may be employed to disperse and suspend the particles in the reaction mixture. Unlike conventional oxide, nitride, and sulfide phosphors, the fluoride phosphor may be quite brittle due to its ionic chemical composition. To ensure a uniform coating, the reaction mixture may be agitated to mix and suspend the particles therein; however, if this agitation is not done carefully, damage to the particles may result. Even moderate stirring with a magnetic stirbar may be sufficient to severely damage the particles over the typically long reaction times. To address this issue, a variety of gentle stirring methods that can suspend the particles in the reaction mixture without damaging them may be employed. A first method uses an orbital shaker to agitate the reaction vessel externally. In this case, the phosphor particles are in contact only with the vessel walls and the reaction mixture. A second method uses an overhead motor to drive an impeller. With careful selection of the impeller shape, the particles can be suspended with minimal shear, thereby reducing damage. In addition to orbital shaking and overhead stirring with an impeller, tumbling, and/or magnetic stirring may be employed.

The catalyst may be a basic or acidic catalyst. It is preferred that a nonaqueous catalyst is employed for the reaction instead of the aqueous acids or bases typically used in sol-gel methods. For example, the basic catalyst may comprise an organic amine, such as diisopropylethylamine (DIPEA) or triethylamine (TEA). As mentioned above, KSF:Mn is unstable towards water, yet water is typically a necessary reagent in silicate-forming sol-gel processes; thus, its concentration may be a critical parameter. By using a nonaqueous catalyst, the concentrations of water and the catalyst can be independently controlled in the reaction mixture. For example, a coating reaction can be performed with an arbitrarily high catalyst loading and a stoichiometric quantity (or even less) of water. In contrast, concentrated ammonia and hydrochloric acid, which are aqueous basic and acidic catalysts, respectively, are about 65% water by weight. It is noted that the catalyst and the reactive silicate precursor may in some cases be part of the same molecule. An example is aminopropyltriethoxysilane (APTES), which includes triethoxysilane, an exemplary silicate precursor, and an amine, an exemplary catalyst.

The water employed as a reagent may be independently added to the reaction mixture as a liquid. Alternatively, the water may be incorporated into the reaction mixture with the solvent, where it may be present as an impurity. In another example, the water may be added to the reaction mixture via a moisture-containing gas stream or by diffusion from the atmosphere, which may have a controlled humidity level.

The solvent is preferably miscible with all the reagents used in the reaction and has low to moderate polarity. The solvent may comprise an organic solvent such as tetrahydrofuran, toluene, or isopropanol. The solvent may be rigorously dried prior to incorporation in the reaction mixture to ensure that unwanted water is not added. If the concentration of water in the reaction mixture is too high (e.g., greater than about 10 vol. %), the silicate may nucleate rapidly away from the surface of the particles, which is undesirable. Saturated toluene at 80% relative humidity and room temperature (20-25° C.) may provide a practical limit for water concentration.

The reactive silicate precursor may be selected from tetraethylorthosilicate (TEOS), tetramethylorthosilicate (TMOS), and tetrapropylorthosilicate (TPOS), or combinations of these. The reactive silicate precursor may comprise a reactive silica precursor. The inorganic coating may be modified by incorporation of organic residues into the silica network. Thus, the method may include adding an organosilane to the reaction mixture. For example, to add carbon to the inorganic coating, the reactive silicate precursor may comprise methyl-, ethyl-, or propyltriethoxysilane, thereby incorporating methyl, ethyl, or propyl groups, respectively. To incorporate nitrogen or sulfur to the coating, the reactive silicate precursor may comprise 3-aminopropyltriethoxysilane or 3-mercaptopropyltriethoxysilane.

An organosilane may also or alternatively be employed prior to the coating reaction to bond with the particles and act as an adhesion promoter for formation of the coating. Thus, the method may include, prior to forming the reaction mixture, exposing the phosphor particles to an organosilane or other adhesion promoter. Typically, the particles are mixed with the organosilane and stirred for a period of time before adding other reagents to the reaction mixture. Suitable organosilanes have a head group that binds or coordinates to the surface of the KSF:Mn particles and a tail group that can react with additional silicate-forming precursors, such as TEOS. Examples of suitable adhesion promoters are 3-aminopropyltriethoxysilane (3-APTES) and 3-mercaptopropyltriethoxysilane (3-MPTES). These molecules have amine and thiol head groups, respectively, and triethoxysilane tail groups.

The inorganic coating may include multicomponent silicates, borates, aluminates, and/or titanates. In other words, the coating may comprise a silicate including the elements silicon and oxygen, and may further comprise a multicomponent silicate, borate, aluminate, or titanate, as indicated above. Or, the silicate of the inorganic coating, which includes the elements silicon and oxygen, may further include additional elements, such as boron, aluminum and/or titanium, and thus the silicate may be referred to as a multicomponent silicate. Accordingly, the method may further comprise adding a reactive metal oxide precursor comprising boron, aluminum and/or titanium to the reaction mixture. For example, the reactive metal oxide precursor may comprise an alkoxide, such as boron alkoxide, aluminum alkoxide and/or titanium alkoxide.

After forming the stabilized fluoride phosphor, the silicate-coated particles may be heated or annealed at an elevated temperature (e.g., from about 200° C. to 700° C.) for a suitable time duration to densify the coating. For example, the annealing may be carried out for a time duration from about 5 mins to 72 hours, preferably in a controlled environment. The annealing may be carried out in an inert gas, in oxygen/air, or in a reducing atmosphere. Annealing the stabilized phosphor in this way may reduce porosity in the coating, transform Si—OH bonds to silica bonds, and improve the protective ability of the coating.

A secondary inorganic coating, such as an oxide coating or shell, may be deposited on the (primary) inorganic coating. The secondary inorganic coating may have a substantially identical composition to the primary inorganic coating and merely increase the silicate thickness, or the secondary inorganic coating may have a different composition and/or different properties compared to the primary inorganic coating. For example, the primary inorganic coating may have higher porosity and lower density while the secondary inorganic coating may have lower porosity and higher density. Furthermore, the primary and secondary inorganic coatings may be prepared by different processes. For example, a primary inorganic coating of silica may be prepared using a base catalyst and an excess of water whereas a secondary inorganic coating of silica may be prepared using an acid catalyst and a stoichiometric amount of water; the base catalyst may be a nonaqueous catalyst, while the acid catalyst used to form the secondary inorganic coating may be an aqueous catalyst.

EXAMPLES

In a nitrogen glovebox, 500 mg of KSF:Mn is added to an oven-dried glass vial along with 15 ml of dry tetrahydrofuran (THF) and 0.440 ml of diisopropylethylamine. The vial is sealed with a septum-cap and brought out of the glovebox. 0.250 ml tetraethylorthosilicate (TEOS) is then added through the septum followed by 0.240 ml of water. The vial is then agitated using an orbital shaker to suspend the KSF particles in the reaction mixture. Additional portions of 0.250 ml of TEOS are added after 24 and 48 hours. After 72 hours, the silica-coated particles are collected by centrifugation and washed twice with 15 ml THF. The stabilized fluoride phosphor is then air-dried for 1 hour, and then dried in an oven at 70° C. for 1 hour.

In a large polypropylene cup, 5.0 g KSF:Mn is combined with 150 ml of water-saturated toluene and 6.0 ml 3-APTES. The mixture is stirred for 20 hours to allow the adhesion promoter to adhere to the particle surface. 1.0 ml TEOS is then added, followed by two additional portions of TEOS at 24 and 48 hours following the first addition. 24 hours after the final addition of TEOS, the silica-coated product is collected by centrifugation and washed two times with toluene. The stabilized fluoride phosphor is then dried at 80° C. for 2 hours.

The above-described stabilized fluoride phosphor may be employed in various light emitting devices, such as illumination-class, phosphor-converted warm-white LEDs (both mid- and high-power), especially those with a color-rendering index (CRI) greater than 90. Such LEDs are well-suited for application in high-quality indoor lighting products, which combine high color quality and high efficacy. In addition, the stabilized fluoride phosphor may be used instead of or in combination with conventional phosphors in phosphor-converted red LEDs (e.g., pc-red). Examples of such lighting products are discussed below. It is also worth noting that, due to its narrow-band red emission, the silica-coated KSF:Mn phosphor may be used in display backlighting for TVs, monitors, tablets, and smart phones. Finally, the stabilized fluoride phosphor may be useful for certain horticultural lighting applications, where a narrow red-emission band could be targeted to specific plant absorptions (e.g., chlorophyll A, chlorophyll B, phytochrome).

Figure 7A:
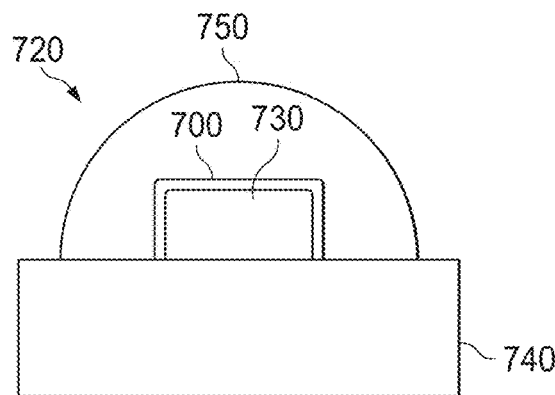
FIG. 7A shows an exemplary light emitting device comprising an LED chip in optical communication with a stabilized fluoride phosphor.

As mentioned above, the stabilized fluoride phosphor may be employed in a light emitting device, such as that shown schematically in FIG. 7A. The light emitting device 720 may include a blue light emitting diode (LED) chip 730 having a dominant wavelength of 420 nm to 490 nm in optical communication with a wavelength conversion material comprising the stabilized fluoride phosphor 700 (which may have any of the characteristics described above or elsewhere in this disclosure) for down conversion of light emitted from the blue LED chip 730. The light emitting device may exhibit narrow-band red light emission with a peak emission wavelength in a range from 610 nm to 660 nm and a full-width-at-half-maximum (FWHM) of less than 45 nm.

The blue LED chip 730 may be disposed on a submount (substrate) 740 and a lens or encapsulant 750 may overlie the LED chip 730, although other submount or package configurations are possible as described below.

The stabilized fluoride phosphor 700 may be employed in any of a number of configurations. For example, a coating on the LED chip may include the stabilized fluoride phosphor 700, as illustrated in FIG. 7A. Alternatively, a lens overlying the LED chip or an encapsulant on the LED chip may include the stabilized fluoride phosphor. For example, the stabilized fluoride phosphor 700 may be coated on an inner or outer surface of the lens, or the composite 700 may be dispersed throughout the volume of the encapsulant. In another example, a substrate disposed remote from the LED chip may include the stabilized fluoride phosphor. More than one type of LED chip (blue and/or other colors) as well as additional phosphors and/or luminescent semiconducting nanoparticles (quantum dots) may be employed in the light emitting device 720.

For example, the wavelength conversion material may further comprise a plurality of quantum dots, such as the stabilized quantum dots described in U.S. Pat. No. 9,780,266, which issued on Oct. 3, 2017, and is hereby incorporated by reference. The wavelength conversion material may also or alternatively further comprise a yellow phosphor exhibiting yellow light emission with a peak emission wavelength in a range from 575 nm to 600 nm. The yellow light emission may have a FWHM of less than 60 nm, in which case the yellow phosphor may be considered to be a narrow-band yellow phosphor. Also or alternatively, the wavelength conversion material may further comprise a green phosphor exhibiting green light emission with a peak emission wavelength in a range from 498 nm to 550 nm. The green light emission may have a FWHM of less than 60 nm, in which case the green phosphor may be considered to be a narrow-band green phosphor. Such yellow and green phosphors are known in the art.

The light emitting device may have any of a number of different packaging configurations. As is well known in the art, in order to use an LED chip in a circuit or other like arrangement, it is known to enclose the LED chip in a package to provide environmental and/or mechanical protection, color selection, light focusing and the like. An LED package may also include electrical leads, contacts or traces for electrically connecting the LED package to an external circuit.

Figure 7B:
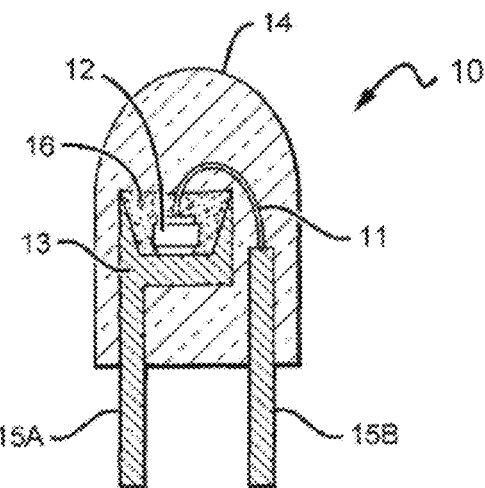
FIGS. 7B-7D show exemplary packaging configurations for a light emitting device including an LED chip and a stabilized fluoride phosphor.

A typical LED package 10 is illustrated in FIG. 7B. In this example, a single LED chip 12 is mounted on a reflective cup 13 by means of a solder bond or conductive epoxy. One or more wire bonds 11 connect the contacts of the LED chip 12 to leads 15A and/or 15B, which may be attached to or integral with the reflective cup 13. The reflective cup may be filled with an encapsulant material 16 which may contain a wavelength conversion material such as the stabilized fluoride phosphor. The entire assembly may be encapsulated in a protective resin 14, which may be molded in the shape of a lens to collimate the light emitted from the LED chip 12.

Figure 7C:
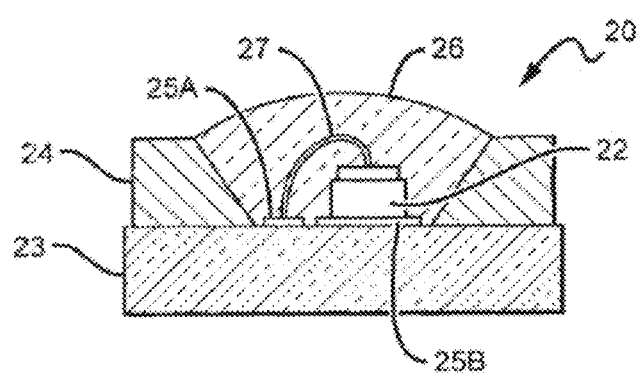

Another conventional LED package 20 is illustrated in FIG. 7C and includes one or more LED chips 22 mounted onto a carrier, such as a printed circuit board (PCB) carrier, as well as leads and a substrate or submount. In this embodiment, a reflector 24 mounted on a submount 23 surrounds the LED chip(s) 22 and reflects light emitted by the LED chip(s) 22 away from the package 20. The reflector 24 also provides mechanical protection to the LED chips 22. One or more wirebond connections 27 may be made between contacts on the LED chips 22 and electrical traces 25A, 25B on the submount 23. The mounted LED chips 22 are then covered with an encapsulant 26, such as a silicone, which may provide environmental and mechanical protection to the chips while also acting as a lens. As described above, the encapsulant may contain wavelength conversion material(s), such as the stabilized fluoride phosphor described herein. Other exemplary LEDs comprise LED packages formed of a plastic material that is molded about a lead frame, and the LED chip(s) is mounted in a cavity of the package, and an optically transmissive encapsulant, such as silicone, is dispensed into the cavity over the LED chip(s). Again, wavelength conversion material(s) such as the stabilized fluoride phosphor can be dispersed in the encapsulant.

Figure 7D:
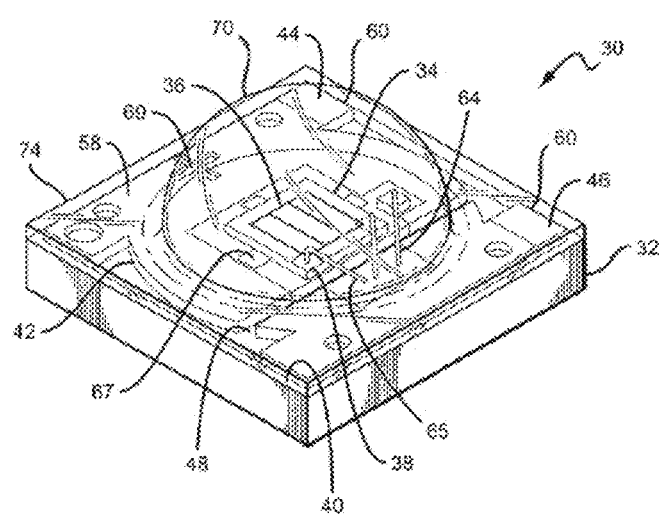

Another exemplary LED package 30 is shown in FIG. 7D and comprises an LED chip 34 on a submount 32 with a molded lens 70, such as a silicone lens, formed over it. The lens 70 can include wavelength conversion material(s), such as the stabilized fluoride phosphor described herein, dispersed therein and/or on the LED chip. The LED chip 32 can also be coated by a conversion material that can convert all or most of the light from the LED. The lens can be molded in different shapes, such as hemispherical, planar, chopped or other shapes. An example of such LEDs is described in U.S. Pat. Nos. 9,070,850 and 9,048,396, assigned to the same assignee as the present application and hereby incorporated by reference. It is noted that other reference numbers shown in FIG. 7D are defined in U.S. Pat. No. 9,070,850. Alternative light emitting device designs that include multiple LEDs mounted within a cavity and covered with an encapsulant with wavelength conversion material(s) dispersed therein are described in U.S. Pat. No. 8,624,271, assigned to the same assignee as the present patent application and hereby incorporated by reference.

LED chips generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED. Light is emitted by the LED chip at a primary wavelength. The primary radiation may be absorbed by the wavelength conversion material (e.g., the stabilized fluoride phosphor), which responsively emits light at secondary wavelength(s). The primary and/or secondary wavelengths of light can mix to produce a desired color of light. As would be understood by one of skill in the art, depending on the primary wavelength(s) and the amount of loading of the wavelength conversion material(s), as well as their light absorption/emission characteristics, various color temperatures of white light can be produced by the LEDs.

The LED chips shown schematically in FIGS. 7A-7D may be group III nitride-based LED chips whose active region is formed from nitrogen and group III elements such as aluminum, gallium and/or indium in the form of nitride layers epitaxially grown and doped, as would be understood by one of ordinary skill in the art, to produce light in the green to UV spectral ranges, for example blue light. As illustrated in the preceding examples, the stabilized fluoride phosphor may be incorporated into silicone or another optically transparent encapsulant material and coated onto the LED chip. In other embodiments, the stabilized fluoride phosphor can be placed in and/or on an encapsulant and/or optic of the LED chip, such as silicone, epoxy or glass. Also, phosphors, such as red nitride phosphors and/or green or yellow LuAG or YAG phosphors, can be mixed together with the stabilized fluoride phosphor in the matrix and/or positioned separately (e.g., in a remote phosphor configuration) on the optic and/or in discrete layers on the LED chip. The result may be a light emitting device that emits warm white light (e.g., 2700K to 4000K) and/or comprises a high CRI (e.g., greater than 90) and/or has an increased gamut.

The LED components, packages and light emitting devices described above may be fabricated using methods known in the art, as described for example in U.S. Patent Application Publication No. 2012/0280261, entitled "Light Emitting Diode (LED) for Achieving an Asymmetric Light Output," which is hereby incorporated by reference. In addition, the blue LED chips may be coated with the aforementioned stabilized fluoride phosphor using any suitable method, such as that described U.S. Patent Application Publication Nos. 2008/0179611 and 2008/0173884, both of which are entitled "Wafer Level Phosphor Coating Method and Devices Fabricated Utilizing Method," and hereby incorporated by reference. As set forth in these patent publications, LED chips can be coated and/or sprayed by phosphors such as the stabilized fluoride phosphor described herein (e.g., in the form of microparticles), and/or other wavelength conversion materials. The LED chips may also be coated using electrophoretic deposition (EPD), such as with the EPD method described in U.S. Pat. No. 8,563,339 to Tarsa et al., entitled "Closed Loop Electrophoretic Deposition of Semiconductor Devices," which is hereby incorporated by reference.

Figure 8A:
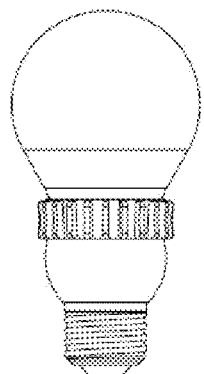
FIGS. 8A-8E show exemplary light fixtures that may utilize the light emitting devices and stabilized fluoride phosphor described herein.
Figure 8B:
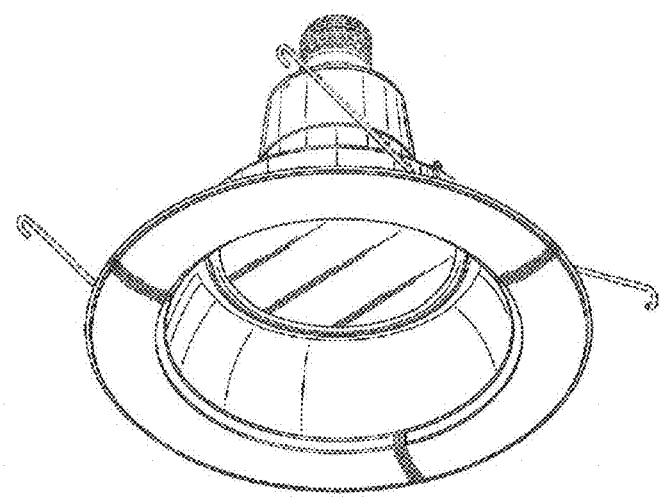
Figure 8C:
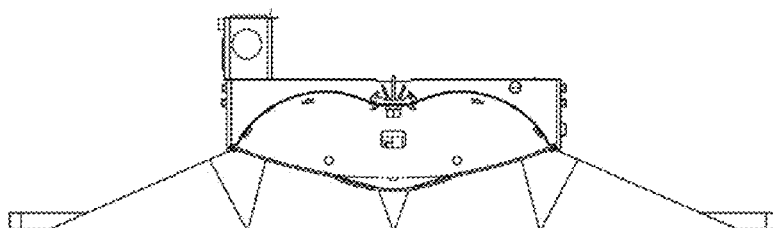
Figure 8D:
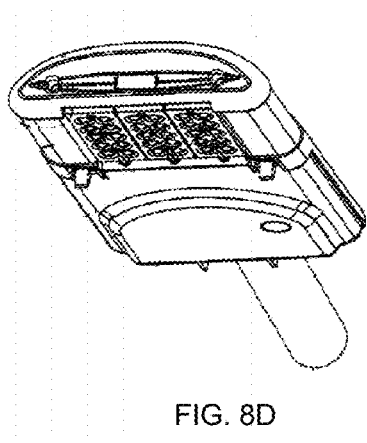
Figure 8E:
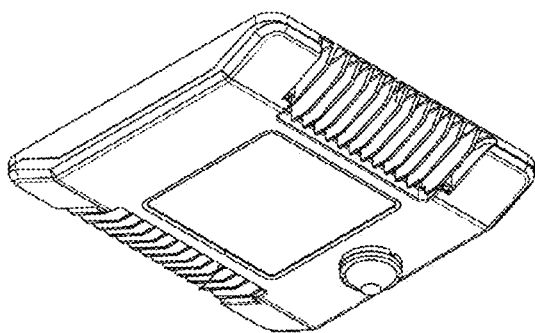

The light emitting devices comprising the stabilized fluoride phosphor described herein may have particular utility with respect to various form factor light fixtures. For example, each of the embodiments disclosed herein may be alternatively implemented in various types of solid state light fixtures including, for example, downlights, troffers, street lights, canopy lights, parking garage lights, lights that use waveguide technology and other lighting fixtures. FIG. 8A illustrates an omnidirectional light bulb, such as an A19 bulb. Other similar consumer lights, such as PAR, BR and candelabra bulbs, can also implement the light emitting devices described herein. Exemplary lights are described in U.S. Pat. Nos. 8,591,062 and 8,596,819 and U.S. Patent Publication No. 2015/0362168, each of which is hereby incorporated by reference. FIG. 8B shows another downlight that can incorporate light emitting devices described herein. An example of such a downlight is disclosed in U.S. Pat. No. 8,777,449, which is hereby incorporated by reference. FIG. 8C illustrates a troffer light fixture that can incorporate the light emitting devices described herein. An exemplary troffer light fixture is disclosed in U.S. Published Patent Publication No. US2012/0327650, which is hereby incorporated by reference. In another example, FIG. 8D illustrates a solid state street light that may include the light emitting devices described herein. Other street lights and outdoor lighting fixtures that can be implemented using the light-emitting devices described herein include the lights disclosed in U.S. Pat. Nos. 8,622,584; 8,425,071; 9,028,087; and U.S. Patent Publication No. 2015/0253488, each of which is hereby incorporated by reference. Finally, FIG. 8E illustrates a canopy light which is described in U.S. Pat. No. 9,182,096, which is hereby incorporated by reference. Light emitting devices described herein may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide-based garage lights disclosed in U.S. Patent Publication No. 2014/0355302, each of which is hereby incorporated by reference. Other and similar light fixtures can be implemented using the above-described circuitry.

As known to those skilled in the art, lamps have been developed utilizing solid state light sources, such as LEDs, in combination with a conversion material that is separated from or remote to the LEDs. Such arrangements are disclosed in U.S. Pat. No. 6,350,041, entitled "High Output Radial Dispersing Lamp Using a Solid State Light Source," which is hereby incorporated by reference. Suitable lamps can comprise a solid state light source that transmits light through a separator to a disperser including one or more phosphors and/or the stabilized fluoride phosphor. The disperser can disperse the light in a desired pattern and/or changes its color by converting at least some of the light to a different wavelength through the phosphor(s), stabilized fluoride phosphor, and/or other wavelength conversion material. In some embodiments, the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759, entitled "Lighting Device," which is hereby incorporated by reference.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A stabilized salt comprising:
   particles comprising a water-soluble salt;
   an inorganic coating on each of the particles, the inorganic coating comprising a silicate, and
   a fluoride coating under the inorganic coating.

2. The stabilized salt of claim 1, wherein the silicate comprises $SiO_x$, where $0.5 \leq x \leq 2.5$.

3. The stabilized salt of claim 1 having a chemical formula $A_xB_yC_z$, where x is from about 1 to about 2, y is from about 1 to about 2, and z is about 6, and where A is selected from Na, Cs, Ca, Sr, and Ba, B is selected from Si, Ge, Sn, Ti, and Al, and C is selected from F and Cl.

4. The stabilized salt of claim 1, wherein the water-soluble salt is selected from the group consisting of: NaCl, $Na_2SiF_6$, KF, $K_2TiF_6$, $Rb_2SiF_6$, $Cs_2GeF_6$, $Cs_2SiF_6$, $Cs_2MnF_6$, $Cs_2SnF_6$, and $MgCl_2$.

5. The stabilized salt of claim 1, wherein the water-soluble salt comprises $K_2SiF_6$.

6. The stabilized salt of claim 5, wherein the $K_2SiF_6$ includes a manganese activator, the stabilized salt being a stabilized fluoride phosphor.

7. The stabilized salt of claim 1, wherein the inorganic coating comprises a thickness in a range from about 5 nm to about 2 microns.

8. The stabilized salt of claim 7, wherein the thickness is in the range from about 0.1 micron to about 2 microns.

9. The stabilized salt of claim 1, wherein the inorganic coating further comprises Si—OH groups.

10. The stabilized salt of claim 1, wherein the silicate comprises a multicomponent silicate including aluminum, boron, and/or titanium.

11. The stabilized salt of claim 1, wherein the inorganic coating further comprises an oxide of aluminum, boron, and/or titanium.

12. The stabilized salt of claim 1, wherein the inorganic coating further comprises carbon.

13. The stabilized salt of claim 1, wherein the inorganic coating further comprises nitrogen or sulfur.

14. The stabilized salt of claim 1, wherein the particles have a nominal size in a range from about 5 microns to about 30 microns.

* * * * *